United States Patent
Hunter et al.

(10) Patent No.: US 10,075,246 B2
(45) Date of Patent: Sep. 11, 2018

(54) OPTICAL ISOLATOR MOUNTED IN PRINTED CIRCUIT BOARD RECESS

(71) Applicant: Rosemount Inc., Chanhassen, MN (US)

(72) Inventors: Kirk Allan Hunter, Shakopee, MN (US); Jared James Dreier, Chaska, MN (US); Jordan Dennis Lucht, Maple Grove, MN (US); Samuel Ethan Messenger, Chaska, MN (US)

(73) Assignee: MICRO MOTION, INC., Boulder, CO (US)

( * ) Notice: Subject to any disclaimer, the term of this patent is extended or adjusted under 35 U.S.C. 154(b) by 52 days.

(21) Appl. No.: 14/037,852

(22) Filed: Sep. 26, 2013

(65) Prior Publication Data
US 2015/0083942 A1    Mar. 26, 2015

(51) Int. Cl.
*H01J 40/14*    (2006.01)
*H04B 10/80*    (2013.01)
(Continued)

(52) U.S. Cl.
CPC ......... *H04B 10/802* (2013.01); *H05K 1/0274* (2013.01); *H05K 3/0047* (2013.01); *H05K 3/32* (2013.01); *H05K 1/0256* (2013.01); *H05K 2201/09036* (2013.01); *H05K 2201/10121* (2013.01); *H05K 2201/10545* (2013.01); *Y10T 29/4913* (2015.01)

(58) Field of Classification Search
CPC ..................................................... H04B 1/587
USPC ...... 250/221, 551; 385/15–52; 257/666, 676
See application file for complete search history.

(56) References Cited

U.S. PATENT DOCUMENTS

| 4,857,746 A | * | 8/1989 | Kuhlmann | ............ H01L 31/167 |
| | | | | 250/551 |
| 5,639,970 A | | 6/1997 | Schulz | |

(Continued)

FOREIGN PATENT DOCUMENTS

| CN | 1965257 | | 5/2007 | |
| CN | 102192443 | * | 9/2011 | .............. F21V 29/00 |

(Continued)

OTHER PUBLICATIONS

Notification of Transmittal of the International Search Report and the Written Opinion of the International Searching Authority for PCT/US2014/052467, dated Nov. 20, 2014.

(Continued)

Primary Examiner — Kevin Pyo
(74) Attorney, Agent, or Firm — Westman, Champlin & Koehler, P.A.

(57) ABSTRACT

An optical isolator is provided. The optical isolator includes a printed circuit board having a first surface and a second surface opposite the first surface. The printed circuit board has a recess extending only partially through the board. The first photoelement has an active surface and is mounted relative to the first surface of the printed circuit board. A second photoelement has an active surface and is mounted relative to the second surface. The second photoelement is configured to interact with the first photoelement. At least one of the first and second photoelements has its active surface disposed at least partially in the recess. A portion of the printed circuit board is interposed between the first and second photoelements.

23 Claims, 3 Drawing Sheets

(51) Int. Cl.
*H05K 3/00* (2006.01)
*H05K 3/32* (2006.01)
*H05K 1/02* (2006.01)

(56) References Cited

U.S. PATENT DOCUMENTS

| | | | | |
|---|---|---|---|---|
| 5,990,475 | A * | 11/1999 | Alegi | H04B 10/802 250/239 |
| 5,995,252 | A | 11/1999 | Nemer et al. | |
| 6,256,016 | B1 * | 7/2001 | Piot | G06F 3/0317 250/208.2 |
| 6,555,935 | B1 | 4/2003 | Maskovyak et al. | |
| 6,657,476 | B1 | 12/2003 | Bicking | |
| 7,019,318 | B2 | 3/2006 | Breinlinger | |
| 7,619,418 | B2 | 11/2009 | Schulz et al. | |
| 7,714,562 | B2 | 5/2010 | Oswald et al. | |
| 8,604,436 | B1 * | 12/2013 | Patel et al. | 250/338.1 |
| 8,772,909 | B1 * | 7/2014 | Vinciarelli | 257/531 |
| 2001/0036337 | A1 * | 11/2001 | Kishida | G02B 6/42 385/49 |
| 2002/0154869 | A1 * | 10/2002 | Chan | G02B 6/4292 385/88 |
| 2004/0181358 | A1 | 9/2004 | Youngquist | |
| 2005/0116145 | A1 * | 6/2005 | Aki | H01L 23/552 250/214.1 |
| 2008/0012428 | A1 | 1/2008 | Lalla | |
| 2008/0074309 | A1 | 3/2008 | Nilsson | |
| 2008/0147336 | A1 | 6/2008 | Karbula et al. | |
| 2008/0258736 | A1 | 10/2008 | Schulz et al. | |
| 2008/0260326 | A1 | 10/2008 | Yabre et al. | |
| 2010/0155627 | A1 | 6/2010 | Baumgartner et al. | |
| 2012/0082413 | A1 * | 4/2012 | Alameh | G02B 6/4249 385/24 |
| 2013/0197818 | A1 | 8/2013 | Karbula et al. | |
| 2013/0240764 | A1 | 9/2013 | Kravitz | |
| 2014/0191143 | A1 * | 7/2014 | Shih et al. | 250/551 |
| 2014/0231635 | A1 * | 8/2014 | Kerness | G01S 17/026 250/226 |

FOREIGN PATENT DOCUMENTS

| | | |
|---|---|---|
| DE | 10 2009 008 087 | 8/2010 |
| DE | 10 2010 012 064 | 9/2011 |
| JP | 53-123690 | 10/1978 |
| JP | 11-54790 | 2/1999 |
| JP | 2010-283007 | 12/2010 |
| RU | 2 373 605 | 11/2009 |
| WO | WO 01/39515 | 5/2001 |
| WO | WO 2010/043876 | 4/2010 |

OTHER PUBLICATIONS

Notification of Transmittal of the International Search Report and the Written Opinion of the International Searching Authority for PCT/US2014/050512, dated Nov. 12, 2014.
Notification of Transmittal of the International Search Report and the Written Opinion of the International Searching Authority for PCT/US2014/049554, dated Nov. 26, 2014.
Office Action from U.S. Appl. No. 14/038,117, dated Nov. 7, 2014.
High-Speed Switching Transistor Handbook, Motorola, edited by William D. Reohr, 1963.
Final Office Action from U.S. Appl. No. 14/038,117, dated Mar. 26, 2015.
Office Action from U.S. Appl. No. 14/037,983, dated Jun. 4, 2015.
"Analysis and Design of Boost DC-DC Converters for Intrinsic Safety", by Liu et al., IEEE, IPEMC, 2006, pp. 1-6.
"Optocoupler Designers Guide", Agilent Technologies, Jun. 7, 2002, pgs. cover page, abstract page, table of content (2 pages) and pp. 1-78.
EP Communication from European Patent Application No. 14761508.2, dated May 6, 2016.
Office Action from Canadian Patent Application No. 2,923,172, dated Feb. 6, 2017.
Office Action from Chinese Patent Application No. 201410164007.7, dated Feb. 28, 2017.
Office Action from Russian Patent Application No. 2016116037, dated Jun. 27, 2017.
Office Action from Japanese Patent Application No. 2016-516972, dated Mar. 29, 2017.
Office Action from Chinese Patent Application No. 201410164007.7, dated Dec. 5, 2017.
Office Action from Canadian Patent Application No. 2,923,172, dated Dec. 27, 2017.
Office Action from Japanese Patent Application No. 2016-516972, dated Jan. 24, 2018.
Office Action from Chinese Patent Application No. 201410164007.7, dated Jun. 5, 2018.
Office Action from Canadian Patent Application No. 2,923,172, dated Jul 27, 2018.

* cited by examiner

OPTICAL ISOLATOR MOUNTED IN PRINTED CIRCUIT BOARD RECESS

BACKGROUND

An optical isolator, also known as an opto-isolator, optocoupler, or photo coupler, is an electrical arrangement that transfers electrical signals between two isolated circuits using different frequencies of the electromagnetic spectrum. The isolation between circuits prevents large voltages or current induced or otherwise present in one of the circuits from being transferred or coupled to the other circuit. Typical optical isolators cannot transfer measurable power between the circuits, but can convey signals between the isolated circuits. As can be appreciated, optical isolators enjoy widespread use in a variety of electronics where isolation is desired.

One particular electronic device that employs optical isolators is known as a field device. Field devices are used by the process control and measurement industry for a variety of purposes. Usually, such field devices have a field-hardened enclosure so that they can be installed outdoors in relatively rugged environments and be able to withstand climatological extremes of temperature, humidity, vibration and mechanical shock. Field devices also typically operate on relatively low power. For example, some field devices are currently available that receive all of their operating power from a known 4-20 mA loop operating at relatively low voltages (12-42 VDC).

The environment within which the field devices operate can sometimes be highly volatile. Some environments may be so volatile that a spark dissipating energy in the μJoule range or even a sufficiently high surface temperature of an electrical component could cause local atmosphere to ignite and propagate an explosion. These areas are referred to as Hazardous, Classified, or Ex areas. As a method of preventing unwanted ignitions, intrinsic safety specifications have been developed as a means of limited energy and temperature in field devices. Compliance with an intrinsic safety requirement helps ensures that even under fault conditions, the circuitry or device itself cannot ignite a volatile environment.

One technique that can be used to comply with intrinsic safety standards is to separate components with a physical barrier. The amount of separation is dependent on the specific material used to form the physical barrier. Optical isolators can be used to transmit data across the barrier if they are separated in accordance with intrinsic safety standards.

SUMMARY

An optical isolator is provided. The optical isolator includes a printed circuit board having a first surface and a second surface opposite the first surface. The printed circuit board has a recess extending only partially through the board. The first photoelement has an active surface and is mounted relative to the first surface of the printed circuit board. A second photoelement has an active surface and is mounted relative to the second surface. The second photoelement is configured to interact with the first photoelement. At least one of the first and second photoelements has its active surface disposed at least partially in the recess. A portion of the printed circuit board is interposed between the first and second photoelements.

DETAILED DESCRIPTION OF ILLUSTRATIVE EMBODIMENTS

In accordance with embodiments of the present invention, a photoemitter and a photodetector, such as an IR photo diode, are spaced apart on opposite sides of a printed circuit board. A portion of the printed circuit board physically separates the photoemitter and the photodetector. The photoemitter and the photodetector operate to form an optocoupler using the printed circuit board itself as solid insulation. The 60079-11 requirements for component protection need not be considered if the photoemitter and the photodetector are not close-coupled components, such as a single integrated circuit (IC) package. The printed circuit board material itself is used as the required infallible spacing component to component. Thus, the need for protecting the components is eliminated, thereby reducing component count, board space requirements, and cost. Further, many of the other tests specified in section 10.11 are no longer applicable, so the testing effort is also significantly reduced.

Figure 1:
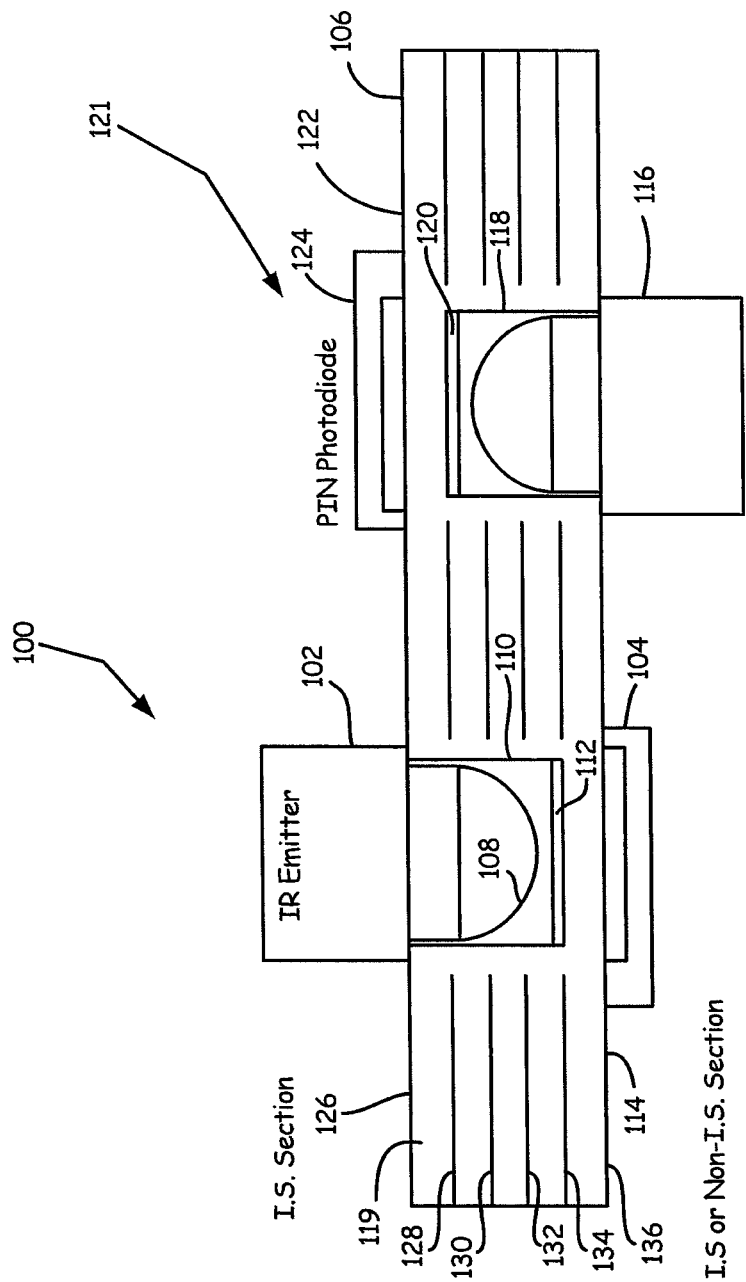
FIG. 1 is a diagrammatic view of a pair of optocouplers in accordance with an embodiment of the present invention.

FIG. 1 is a diagrammatic view of a pair of optocouplers in accordance with an embodiment of the present invention. Optocoupler 100 is formed by photoemitter 102 and photodetector 104 arranged on opposite sides of printed circuit board 106. In the embodiment illustrated in FIG. 1, photoemitter 102 is an infrared photo diode having a hemispherical portion 108 that is received within bore 110 in printed circuit board 106. Additionally, in this embodiment, photodetector 104 is a PIN diode. This arrangement could be considered to show a pair of cooperative photoelements where at least one of the photoelements (in this case the photoemitter) has an active surface that is at least partially disposed in a recess of printed circuit board 106. In accordance with one embodiment of the present invention, bore or recess 110 ends in surface 112 and the sidewalls of recess 110 preferably meet surface 112 at approximately 90 degrees. Surface 112 is spaced from surface 114 of printed circuit board 106 by at least 0.2 mm, which is the minimum requirement of solid material in order to comply with 60079-11 appendix F for 300V. Photodetector 104 is mounted adjacent surface 114 such that light emitted from photoemitter 102, which passes through surface 112, is detected by photodetector 104. In this way, emitter 102 and detector 104 cooperate to form an optocoupler. As can be appreciated, the arrangement of photoemitter 102 and photodetector 104 provide signal communication in a single direction (from photoemitter to photodetector). Thus, in order to provide bi-directional communication across printed circuit board 106, a second optocoupler 121 is provided which is substantially the reverse of optocoupler 100. Specifically, optocoupler 121 includes photoemitter 116 extending into bore or recess 118 within printed circuit board 106. Recess 118 terminates in surface 120 that is spaced from surface 122 of printed circuit board 106 by the minimum solid insulation dimension (0.2 mm). Photodetector 124, in one embodiment, is mounted adjacent surface 122 such that light passing through surface 120 is detected by photodetector 124. Thus, photoemitter 116 and photodetector 124 comprise a second optocoupler that, in cooperation with optocoupler 100, provides bi-directional communication through print circuit board 106.

FIG. 1 illustrates printed circuit board 106 having six different copper layers 126, 128, 130, 132, 134 and 136, which are separated by printed circuit board (PCB) material 119 and held back or otherwise spaced from recesses 110, 118 by the minimum solid material spacing in accordance with 60079-11, appendix F. Specifically, in the embodiment illustrated in FIG. 1, that spacing is 0.2 mm minimum. Photoemitter 102 extends into recess 110 such that the dome 108 of photoemitter 102 is proximate surface 112. Such proximity increases the signal to noise ratio of optocoupler 100 and allows the overall power to be reduced. While embodiments of the present invention are generally described with a portion of the photoemitter being disposed in the recess of the printed circuit board, it is expressly contemplated that the photodetector could be disposed in a recess instead or as well. However, in all such configurations, at least one active surface (dome of the photoemitter or detecting interface of the photodetector) is disposed within a recess of the printed circuit board.

When properly aligned, the photodetector will receive the signal from the photoemitter that is located directly opposite it. In one embodiment, the photodetector has its active surface aligned with the center of the photoemitter's dome (such as dome 108).

Figure 2:
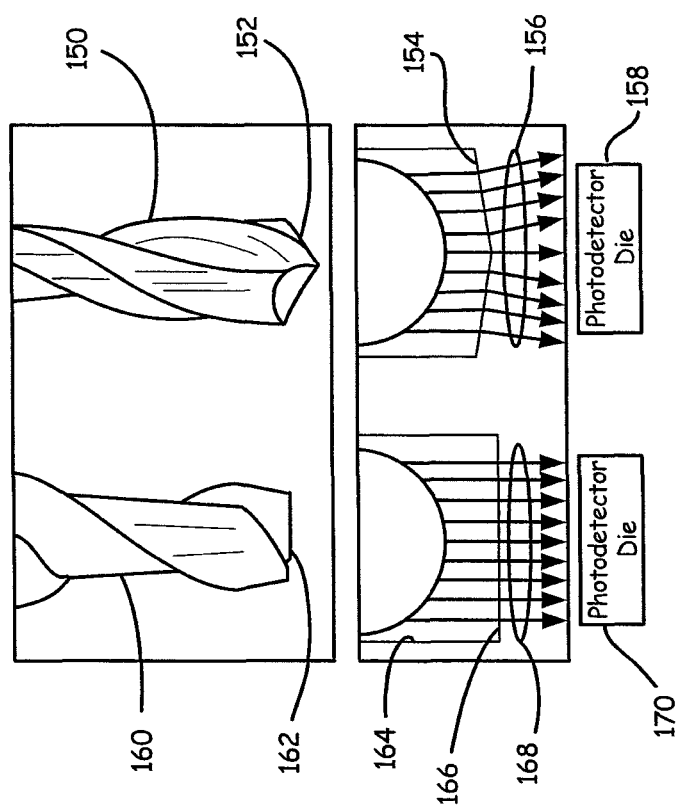
FIG. 2 is a diagrammatic view showing a preferred arrangement for generating a precise spacing in a printed circuit board for an optocoupler in accordance with an embodiment of the present invention.

FIG. 2 is a diagrammatic view of a preferred method of generating recesses 110, 118. Typically, a bore is generated with a drill bit, such as drill bit 150 which has a tapered end 152 resulting in a tapered end surface 154. However, tapered end surface 154 will actually bend or otherwise refract electromagnetic spectrum passing through this interface. Thus, the electromagnetic signal 156 is diffused and the electrical response of photodetector die 158 is attenuated. In a preferred embodiment, a flat bottom bit 160 is employed. Bit 160 has an end 162 that is substantially flat. This results in a bore 164 having an end 166 that is at approximately a right angle to the sidewall of bore 164. Flat surface 166 ensures that the signal passing through this air to circuit board interface maintains its original direction and is not refracted or otherwise affected. In this way, signal 168 passes straight through to photodetector die 170, which has a larger response in comparison to photodetector die 158. In another example configuration, the drill bit has a concave shaped end.

Several methods may be employed in accordance with embodiments of the present invention to reduce signal attenuation due to the printed circuit board material and other factors. Specifically, printed circuit board material can be removed while leaving enough material to satisfy the spacing requirements when considering manufacturing tolerances. Further, the photoemitter and photodetector components can be selected for signal strength and optical scatter pattern. Further, a solder mask between the active surfaces of the optical components can be omitted. Finally, as set forth above with respect to FIG. 2, the use of a flat-nosed drill bit for generating the counter bore can be employed. Any or all of these various design considerations cooperate to provide a optocoupler formed of a plurality of discrete components that complies with intrinsic safety specifications very effectively while maintaining a small printed circuit board footprint.

Figure 3:
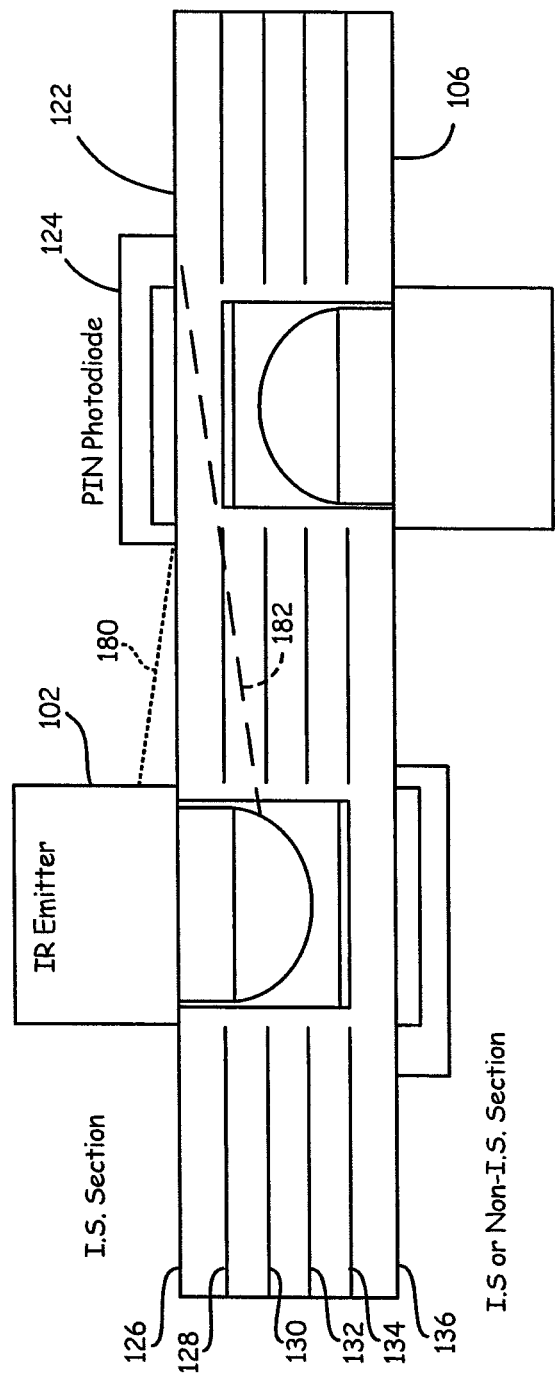
FIG. 3 is a diagrammatic view of a pair of optocouplers indicating the potential for crosstalk between adjacent optocouplers.

As can be appreciated, forming adjacent optocouplers in order to provide isolated bi-directional communication through printed circuit board 106 using discrete components can generate crosstalk between the optocouplers, if unwanted or stray signals are not carefully inhibited. There are two primary ways in which crosstalk can be present. FIG. 3 illustrates these two primary crosstalk channels. The first crosstalk channel is along the board surface as illustrated by dashed line 180. In this case, infrared illumination from photoemitter 102 is able to pass directly along board surface 122 to photodetector 124. This first form of crosstalk can be reduced by increasing the space between photoemitter 102 and photodetector 124. However, increasing the space between these components is not desired since that will consume valuable printed circuit board space. A more favored solution is to add an opaque cover over photodetector 124 such that it cannot receive crosstalk illumination 180. One preferred form of such an opaque cover is opaque potting provided around and/or over photodetector 124. This opaque potting has the added benefit of eliminating the effects of ambient light on photodetector 124. Example materials include epoxy or silicone RTV.

The second channel of crosstalk illustrated in FIG. 3 is shown at reference numeral 182. Specifically, this crosstalk channel is generated by infrared illumination passing within the material of printed circuit board 106. This crosstalk can be reduced by placing copper layers 126, 128, 130, 132, 134, 136 closer together to force the light to diffuse more rapidly when traveling through the board. Further, placing the copper layers closer to the photoemitter recess reduces the amount of signal that scatters away from the photodetector. This reduces the size of the opening through the copper layers and thereby blocks crosstalk channel 182. Additionally, the interior wall of the recess can be treated to facilitate signal transmission from the photoemitter to the photodetector and/or treated to reduce cross talk. For example, a sleeve can be inserted about the dome of the emitter or the recess itself can be coated or otherwise treated with a material to facilitate signal transmission.

Embodiments of the present invention generally provide a highly compact optocoupler arrangement that can easily satisfy intrinsic safety specifications for field devices and other electronics. It is believed that the optocouplers in accordance with embodiments of the present invention can provide signal coupling at 125 kHz, and possibly as high as 250 kHz.

Embodiments of the present invention can be used in any electronic device where optocouplers are warranted. However, embodiments of the present invention are particularly useful for field devices that must comply within an intrinsic safety specification, such as that set forth above.

Although the present invention has been described with reference to preferred embodiments, workers skilled in the art will recognize that changes may be made in form and detail without departing from the spirit and scope of the invention. The above discussion refers to a solid separation of 0.2 mm between the optical components. Although such a configuration is specifically directed to providing isolation between an intrinsically safe region to an non-intrinsically safe region, the invention is not limited to this configuration. The same isolation distance can be used to isolate intrinsically safe sections from one another. Similarly, the amount of separation may be more or less than 0.2 mm depending upon isolation requirements and design constraints. The invention is applicable to electromagnetic radiation of any frequency including visible light, infrared and ultraviolet radiation. A translucent filler medium can be applied between the photo emitter and the printed circuit card to reduce attenuation due to refraction and reflection between the different medium layers.

What is claimed is:

1. An optical isolator comprising:
   a printed circuit board having an intrinsically safe first surface that meets an intrinsically safe specification of field devices such that even under fault conditions, circuitry on the intrinsically safe first surface cannot itself ignite a volatile environment, and a second surface on an opposite side from the intrinsically safe first surface, the printed circuit board having a recess extending only partially therethough, the recess defined by sidewalls that terminate at an end surface such that the end surface is separated from the intrinsically safe first surface by the sidewalls;
   a first photoelement having an active surface, the first photoelement being mounted to the printed circuit board;
   a second photoelement having an active surface, the second photoelement being mounted at least partially in the recess; and
   wherein the end surface is interposed between the active surface of the first photoelement and the active surface of the second photoelement such that light emitted from the active surface of one of the first and second photoelements that passes into the end surface is detected at the active surface of the other of the first and second photoelements.

2. The optical isolator of claim 1, wherein the recess is round.

3. The optical isolator of claim 2, wherein the end surface meets a sidewall of the recess at a substantially right angle.

4. The optical isolator of claim 2, wherein the end surface is flat.

5. The optical isolator of claim 1, wherein one of the first photoelement and the second photoelement is a photoemitter.

6. The optical isolator of claim 5, wherein the photoemitter is a light emitting diode.

7. The optical isolator of claim 6, wherein the light emitting diode is an IR light emitting diode.

8. The optical isolator of claim 5, wherein the photoemitter is at least partially disposed in the recess.

9. The optical isolator of claim 8, wherein the photoemitter has a dome that is disposed in the recess.

10. The optical isolator of claim 1, wherein one of the first photoelement and the second photoelement is a photodetector.

11. The optical isolator of claim 10, wherein the photodetector is a PIN diode.

12. The optical isolator of claim 10, wherein the photodetector is covered by an opaque cover.

13. The optical isolator of claim 1, wherein a portion of the printed circuit board interposed between the first and second photoelements is a minimum spacing for an intrinsic safety specification of an optocoupler.

14. The optical isolator of claim 13, wherein the minimum spacing is at least 0.2 mm.

15. The optical isolator of claim 13, wherein the printed circuit board has a plurality of copper containing layers, and wherein copper in all such copper-containing layers is disposed at least the minimum spacing distance from the recess.

16. A circuit arrangement comprising:
   a printed circuit board having an intrinsically safe first surface meeting an intrinsically safe specification of field devices such that even under fault conditions, circuitry on the intrinsically safe first surface cannot itself ignite a volatile environment and a second surface on an opposite side from the intrinsically safe first surface, the printed circuit board having a first recess extending only partially therethough, the first recess defined by first sidewalls that terminate at a first end surface such that the first end surface is separated from the intrinsically safe first surface by the first sidewalls and a second recess spaced from the first recess and also extending only partially therethrough, the second recess defined by second sidewalls that terminate at a second end surface such that the second end surface is separated from the second surface by the second sidewalls;
   a first photoemitter mounted on the printed circuit board and having an active surface at least partially disposed in the first recess;
   a first photodetector mounted on the second surface, the first photodetector being spaced from the first photoemitter by a portion of the printed circuit board interposed therebetween such that the first end surface is between the first photoemitter and the first photodetector and such that light emitted by the first photoemitter that passes into the first end surface is detected by the first photodetector;
   a second photodetector mounted on the intrinsically safe first surface; and
   a second photoemitter mounted on the printed circuit board and having an active surface at least partially disposed in the second recess, the second photodetector being spaced from the second photoemitter by a portion of the printed circuit board interposed therebetween such that the second end surface is between the second photoemitter and the second photodetector and such that light emitted by the second photoemitter that passes into the second end surface is detected by the second photodetector.

17. The circuit arrangement of claim 16, including a translucent filler medium between the first photo emitter and printed circuit board to reduce attenuation.

18. The circuit arrangement of claim 16, including layers in the printed circuit board proximate the first recess and the second recess which provide attenuation for signal escaping an intended transmission path for a specific electromagnetic spectrum of the signal.

19. The circuit arrangement of claim 16, including hollow cylindrical structure opaque to a specific electromagnetic spectrum in the first recess.

20. The circuit arrangement of claim 16, wherein the printed circuit board includes a plurality of circuit layers wherein the plurality of circuit layers are individually isolated from one another.

21. A method of isolating electrical components, comprising:
   placing first electrical components on an intrinsically safe first side of a printed circuit board wherein the intrinsically safe first side satisfies an intrinsically safe specification of field devices such that even under fault conditions, circuitry on the intrinsically safe first surface cannot itself ignite a volatile environment;
   placing second electrical components on a second side of the printed circuit board which is opposite the intrinsically safe first side;
   forming a recess in the intrinsically safe first side of the printed circuit board which extends partially through the printed circuit board toward the second side, the recess having side walls extending from the intrinsically safe first side of the printed circuit board to a closed end formed by a closed end surface of the recess;

mounting a first photo element having an active surface in the recess and coupled to the first electrical components; and mounting a second photo element having an active surface on the second side of the printed circuit board directed toward the active surface of the first photo element through the closed end surface of the recess, the second photo element configured to interact with the first photo element through the closed end surface of the recess, the second photo element electrically connected to the second electrical components.

22. The method of claim 21, wherein the first photo element comprises a diode.

23. The method of claim 21, wherein forming the recess comprises partially drilling the printed circuit board.

* * * * *